United States Patent [19]

Muench et al.

[11] 4,418,187

[45] Nov. 29, 1983

[54] PREPARATION OF ELECTRICALLY CONDUCTIVE POLYMERS

[75] Inventors: Volker Muench, Ludwigshafen; Herbert Naarmann, Wattenheim; Klaus Penzien, Frankenthal, all of Fed. Rep. of Germany

[73] Assignee: BASF Aktiengesellschaft, Fed. Rep. of Germany

[21] Appl. No.: 254,258

[22] Filed: Apr. 15, 1981

[30] Foreign Application Priority Data

May 14, 1980 [DE] Fed. Rep. of Germany ....... 3018389

[51] Int. Cl.$^3$ .................. C08F 112/32; C08F 126/00; C08F 126/06; C08F 126/12
[52] U.S. Cl. ..................................... 526/259; 252/511; 526/90; 526/96; 526/99; 526/117; 526/154; 526/206; 526/221; 526/263; 526/284; 526/310
[58] Field of Search ..................... 526/90, 96, 99, 117, 526/120, 154, 206, 221, 259, 263, 284, 310; 252/511

[56] References Cited

U.S. PATENT DOCUMENTS 3,679,637 7/1972 Hort ..................................... 526/259

FOREIGN PATENT DOCUMENTS 1149526 4/1969 United Kingdom .
1436201 5/1976 United Kingdom .

OTHER PUBLICATIONS

Chem. Abs., 68, (1968), p. 50357W.
Chem. Abs., 83, (1975), p. 179686S.

*Primary Examiner*—Harry Wong, Jr.
*Attorney, Agent, or Firm*—Keil & Witherspoon

[57] ABSTRACT

A process for the preparation of electrically conductive polymers by polymerizing acenaphthylene, N-vinylheterocyclics, eg. N-vinylcarbazole or N-vinylpyridine, or N,N-divinylaniline at from $-80°$ to $+100°$ C. in the presence of a cationtic catalyst, wherein from 1 to 50 percent by weight of an oxidizing Lewis acid, preferably $FeCl_3$, $FeBr_3$, $SbCl_5$, $SbF_5$, $AsF_5$ or $CF_3$-$SO_3H$, or a combination of $AlCl_3$ or $TiCl_4$ with the said compounds or with $CrO_3$ or $OsO_4$ is used as the catalyst. In a preferred embodiment of the process, thin films of the monomers to be polymerized, applied to glass or to a polymeric base, preferably to a plastic film, are treated with gaseous $SbCl_5$, $SbF_5$ or $AsF_5$. The conductive polymers obtained can be used in the electrical industry for the production of solar cells, for the conversion and fixing of radiation and for the production of electrical and magnetic switches, as well as for the antistatic treatment of plastics.

5 Claims, No Drawings

PREPARATION OF ELECTRICALLY CONDUCTIVE POLYMERS

The present invention relates to a process for the preparation of electrically conductive polymers by polymerizing acenaphthylene, N-vinyl-heterocyclics, eg. N-vinylcarbazole or N-vinylpyridine, or N,N-divinylaniline at from $-80°$ to $+100°$ C. in the presence of a cationic catalyst.

These polymerization processes require from 0.001 to 10% by weight, based on weight of monomers, of the cationic catalysts in order to cause the polymerization to proceed.

The polymerization of vinyl compounds with cationic catalysts has been disclosed (cf. W. R. Soerenson and T. W. Campbell "Preparative Methods of Polymer Chemistry", Interscience Publ., New York 1968, page 265).

It has also been disclosed that electrically conductive polymers may be prepared by oxidative coupling of aromatic compounds by means of Lewis acids (cf. Naturwissenschaften, 56 (1969), 308). However, this process has only been carried out with aromatic and cycloaliphatic systems. The polymers obtained had relatively low molecular weights, with degrees of polymerization of up to about 50, and were accordingly brittle and difficult to process.

It is an object of the present invention to provide high molecular weight, non-brittle polymers possessing good processability and high electrical conductivity.

We have found that this object is achieved by using, as the catalyst for the polymerization of acenaphthylene, N-vinyl-heterocyclics, eg. N-vinylcarbazole or N-vinylpyridine, or N,N-divinylaniline, from 1 to 50, preferably from 10 to 40, % by weight, based on the weight of monomer employed, of an oxidizing Lewis acid.

Preferred Lewis acids are $FeCl_3$, $FeBr_3$, $SbCl_5$, $SbF_5$, $AsF_5$ and $CF_3$-$SO_3$-H, or a combination of $AlCl_3$ or $TiCl_4$ with the said compounds or with $CrO_3$ or $OsO_4$.

In a particularly preferred embodiment, thin films of the monomers to be polymerized, applied to glass or to a plastic film, are treated with gaseous $SbCl_5$, $SbF_5$ or $AsF_5$.

The polymerization temperature used is from $-80°$ to $+100°$ C., preferably from $-30°$ to $+100°$ C. The polymerization process according to the invention can be carried out in conventional solvents and auxiliary fluids but can also be carried out as a mass polymerization.

A particularly preferred embodiment is an oxidative cationic polymerization wherein thin films of the above monomers, applied to one or both sides of glass or of a polymeric base, preferably a polymer film, are polymerized by means of gaseous initiators, eg. $SbCl_5$, $SbF_5$ or $AsF_5$.

The polymers prepared by the process according to the invention are soluble and have intrinsic viscosities of $[\eta]>0.5$, ie. molecular weights greater than 25,000 (according to the conversion formula given in Macromolecular Synthesis, volume I (1974), 83, published by John Wiley, New York). The polymers thus produced have electrical conductivities of about $10^{-10}$—$10^{-3}$ S/cm, depending on the amount of catalyst which has remained in the polymer.

By increasing the amount of catalyst employed according to the invention, during or after the polymerization, to figures of up to 50% by weight, it is possible to achieve electrical conductivities of up to $10^{+2}$ S/cm. The electrical conductivity is measured by the method of F. Beck, Ber. der Bunsenges. 68 (1964), 559.

The electrically conductive polymers prepared according to the invention and having conductivities greater than $10^{-2}$ S/cm may be used for the antistatic treatment of plastics, for the production of solar cells, for the conversion and fixing of radiation and for the production of electrical and magnetic switches. The addition of the strong Lewis acids to the monomers or polymers results in p-conductors (cf. J. Chem. Educ., 46 (1969), No. 2, 82.

In the Examples which follow, parts are by weight.

EXAMPLE 1

10 parts of acenaphthylene are dissolved in 100 parts of diethyl ether at $-50°$ C. and 1 part of antimony pentafluoride is added at the same temperature. Thereafter, the solution is heated to $25°$ C. in the course of 5 hours, and the solvent is then stripped off. The polymer obtained is soluble in benzene and has a molecular weight of about 150,000. The electrical conductivity of this product is $2.5 \times 10^{-2}$ S/cm.

EXAMPLES 2 to 5

On following the procedure described in Example 1, but varying the amount and nature of the solvent and of the initiator, the following results are obtained.

| No. | Solvent | | Temp. °C. | Initiator | | Conductivity S/cm, 30° C. |
|---|---|---|---|---|---|---|
| | | | | Type | Parts | |
| 2 | Benzene | 100 parts | 10 | $AsF_5$ | 2 | $3.8 \times 10^{-1}$ |
| 3 | Toluene | 100 parts | $-50$ | $AsF_5$ | 3 | $8.5 \times 10^{-1}$ |
| 4 | Methylene chloride | 100 parts | $-50$ | $SbF_5$ | 3 | $4.6 \times 10^{-1}$ |
| 5 | Diethyl ether | 100 parts | 0 | $AlCl_3$ $CrO_3$ | 2 0.5 | $3.6 \times 10^{-2}$ |

EXAMPLE 6

The procedure described in Example 1 is followed but varying the monomer; the following results are obtained.

| No. | Monomer | Conductivity, S/cm, 30° C. |
|---|---|---|
| 6 | N—vinylcarbazole | $0.6 \times 10^{-2}$ |
| 7 | N—vinylpyridine | $1.8 \times 10^{-2}$ |
| 8 | 2-Vinylpyridine | $3.6 \times 10^{-2}$ |
| 9 | 4-Vinylpyridine | $0.9 \times 10^{-2}$ |

EXAMPLES 10 to 15

| No. | Polymer from Example | Lewis acid | | Conductivity, S/cm, 30° C. |
|---|---|---|---|---|
| | | Type | Amount | |
| 10 | 1 | $AsF_5$ | 1 | $2.3 \times 10^{+1}$ |
| 11 | 2 | $AsF_5$ | 2 | $4.9 \times 10^{+2}$ |
| 12 | 3 | $CF_3SO_3H$ | 1 | $2.8 \times 10^{+1}$ |
| 13 | 4 | $CF_3SO_3H$ | 2 | $4.5 \times 10^{+1}$ |
| 14 | 5 | $CF_3SO_3H$ | 3 | $3.0 \times 10^{+2}$ |
| 15 | 6 | $CF_3SO_3H$ | 2 | $9.2 \times 10^{+1}$ |

We claim:

1. A process for the preparation of electrically conductive compositions which comprises polymerizing acenaphthylene, N-vinylcarbazole, N-vinylpyridene or N,N-divinylaniline at temperatures of from −80° to 100° C. using, as the catalyst, an oxidizing Lewis acid in an amount of from 10 to 50% by weight, based on the weight of the monomer employed.

2. The process of claim 1, wherein N-vinylcarbazole is polymerized.

3. The process of claim 1, wherein N-vinylpyridine is polymerized.

4. The process of claim 1, wherein N,N,-divinylaniline is polymerized.

5. The process of claim 1, wherein the amount of catalyst is from 10 to 40% by weight.

* * * * *